(12) United States Patent
Hyde

(10) Patent No.: US 7,715,236 B2
(45) Date of Patent: May 11, 2010

(54) FAULT TOLERANT NON VOLATILE MEMORIES AND METHODS

(75) Inventor: John D. Hyde, Corvallis, OR (US)

(73) Assignee: Virage Logic Corporation, Fremont, CA (US)

( * ) Notice: Subject to any disclaimer, the term of this patent is extended or adjusted under 35 U.S.C. 154(b) by 1098 days.

(21) Appl. No.: 11/372,438

(22) Filed: Mar. 9, 2006

(65) Prior Publication Data

US 2006/0220639 A1 Oct. 5, 2006

Related U.S. Application Data

(60) Provisional application No. 60/666,820, filed on Mar. 30, 2005.

(51) Int. Cl.
G11C 11/34 (2006.01)
(52) U.S. Cl. .............. 365/185.2; 365/185.21; 365/185.22; 365/201
(58) Field of Classification Search ............ 365/185.09, 365/185.2, 185.21, 185.22, 190, 201, 189.09
See application file for complete search history.

(56) References Cited

U.S. PATENT DOCUMENTS

| | | | |
|---|---|---|---|
| 4,037,242 A | 7/1977 | Gosney | |
| 5,068,622 A | 11/1991 | Mead et al. | |
| 5,197,028 A * | 3/1993 | Nakai | 365/185.21 |
| 5,450,363 A * | 9/1995 | Christopherson et al. | 341/98 |
| 5,515,317 A | 5/1996 | Wells et al. | |
| 5,574,879 A | 11/1996 | Wells et al. | |
| 5,666,307 A | 9/1997 | Chang | |
| 5,787,038 A * | 7/1998 | Park | 365/185.22 |
| 5,796,656 A | 8/1998 | Kowshik et al. | |
| 5,825,063 A | 10/1998 | Diorio et al. | |
| 5,864,569 A * | 1/1999 | Roohparvar | 714/773 |
| 5,898,613 A | 4/1999 | Diorio et al. | |
| 6,002,623 A * | 12/1999 | Stave et al. | 365/201 |
| 6,097,637 A | 8/2000 | Bauer et al. | |
| 6,137,153 A | 10/2000 | Le et al. | |
| 6,233,717 B1 * | 5/2001 | Choi | 714/805 |
| 6,353,568 B1 * | 3/2002 | Sung | 365/207 |
| 6,363,008 B1 | 3/2002 | Wong | |
| 6,522,584 B1 | 2/2003 | Chen et al. | |
| 6,549,457 B1 | 4/2003 | Srinivasan et al. | |
| 6,558,967 B1 | 5/2003 | Wong | |
| 6,654,286 B2 * | 11/2003 | Kawakami | 365/185.21 |
| 6,693,829 B2 * | 2/2004 | Babudri et al. | 365/185.22 |
| 6,845,039 B2 | 1/2005 | Chen et al. | |

(Continued)

OTHER PUBLICATIONS

Ma, Yanjun et al., "Reliability of pFET EEPROM With 70-Å Tunnel Oxide Manufactured in Generic Logic CMOS Processes", IEEE Transactions on Device and Materials Reliability, vol. 4, No. 3, pp. 353-358, Sep. 2004.

Primary Examiner—Anh Phung
Assistant Examiner—Alexander Sofocleous
(74) Attorney, Agent, or Firm—Nixon Peabody LLP; David B. Ritchie

(57) ABSTRACT

Methods and structure for fault tolerant Non Volatile Memory (NVM) devices are provided. Readings of selected memory cells are compared to two thresholds above and below a neutral value. Consistency of comparison outputs is used to determine a good or bad reading. Parity bit correction can be used to correct bad readings.

25 Claims, 9 Drawing Sheets

*DUAL SENSE AMPLIFIER FOR FAULT TOLERANT NVM*

U.S. PATENT DOCUMENTS

| | | |
|---|---|---|
| 6,845,044 B2 | 1/2005 | Horch et al. |
| 6,870,767 B2 | 3/2005 | Rudelic et al. |
| 6,950,342 B2 | 9/2005 | Lindhorst et al. |
| 6,999,887 B2 * | 2/2006 | Rehm et al. ............ 702/117 |
| 7,057,935 B2 * | 6/2006 | Chevallier ............ 365/185.22 |
| 7,272,041 B2 | 9/2007 | Rahman et al. |
| 2004/0004861 A1 | 1/2004 | Srinivas et al. |
| 2006/0221715 A1 | 10/2006 | Ma et al. |
| 2007/0229230 A1 | 10/2007 | Drago et al. |

* cited by examiner

DEVICE WITH HYBRID NVM

DUAL SENSE AMPLIFIER FOR FAULT TOLERANT NVM

METHODS

*RFID SYSTEM*

*RFID TAG*

FAULT TOLERANT NON VOLATILE MEMORIES AND METHODS

RELATED APPLICATIONS

This utility patent application claims the benefit of U.S. Provisional Application Ser. No. 60/666,820 filed on Mar. 30, 2005, which is hereby claimed under 35 U.S.C. §119(e). The provisional application is incorporated herein by reference.

BACKGROUND

Memory devices are electronic devices arranged to store electrical signals. For example, a basic memory element may be a fuse that can either be open or be closed. Open and closed states of the fuse may be used to designate one bit of information corresponding to a value of 1 or 0, which are sometimes also called a logical value of 1 or 0. Many memory elements can be combined in various arrangements, in order to store multiple bits arranged in words or other combinations. Various electronic circuits including semiconductor devices such as transistors may be used as memory elements.

Memory elements may be classified in two main categories: volatile and non-volatile. Volatile memory requires a source of electrical power to retain its stored data. Most types of random access memory (RAM) fall into this category. Non-volatile memory (NVM) retains its stored data, whether or not it has a source of electrical power.

An NVM device may be implemented as a MOS transistor that has a source, a drain, an access or a control gate, and a floating gate. It is structurally different from a standard MOSFET in that its floating gate is electrically isolated, or "floating".

In many logic device applications, 70A logic CMOS oxides are used, which may be too thin for reliable NVM operation. In such applications, a small but significant number of NVM bits may fail during use—these may also be called tail bits, because they represent the tail of the retention distribution.

In typical applications, the NVM may not be screened for tail bits during production testing. In those, any tail bits are addressed by solutions for fault tolerance, such as redundant bit storage or error correction coding (ECC). Such solutions perform both error detection and error correction of tail bits. Such solutions, however, increase the size of memory circuits, which may result in increased power consumption and cost.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The invention provides NVM devices and methods that are fault tolerant, and where errors are detected separately from being corrected. It will be appreciated that a fault tolerant NVM circuit according to aspects may include any number of NVM sub-circuits of different types. The NVM sub-circuits may be of any type and share a portion or the whole support circuitry.

According to the invention, a "bad" NVM bit is detected when its stored value is ambiguous, because failure has caused a characteristic attribute of the bit to shift towards a neutral value. In addition, the invention can optionally correct the detected error by using a parity bit, rather than the ECC of the prior art.

An advantage of the invention is that, since "bad" NVM bits are identified by a separate method than being corrected, a single parity bit for each set of NVM bits is sufficient for error correction of a one "bad" NVM bit in the set. This may reduce area, complexity, and/or cost.

This and other features and advantages of the invention will be better understood in view of the Detailed Description and the Drawings, in which:

BRIEF DESCRIPTION OF THE DRAWINGS

Non-limiting and non-exhaustive embodiments are described with reference to the following drawings.

DETAILED DESCRIPTION

Figure 1A:
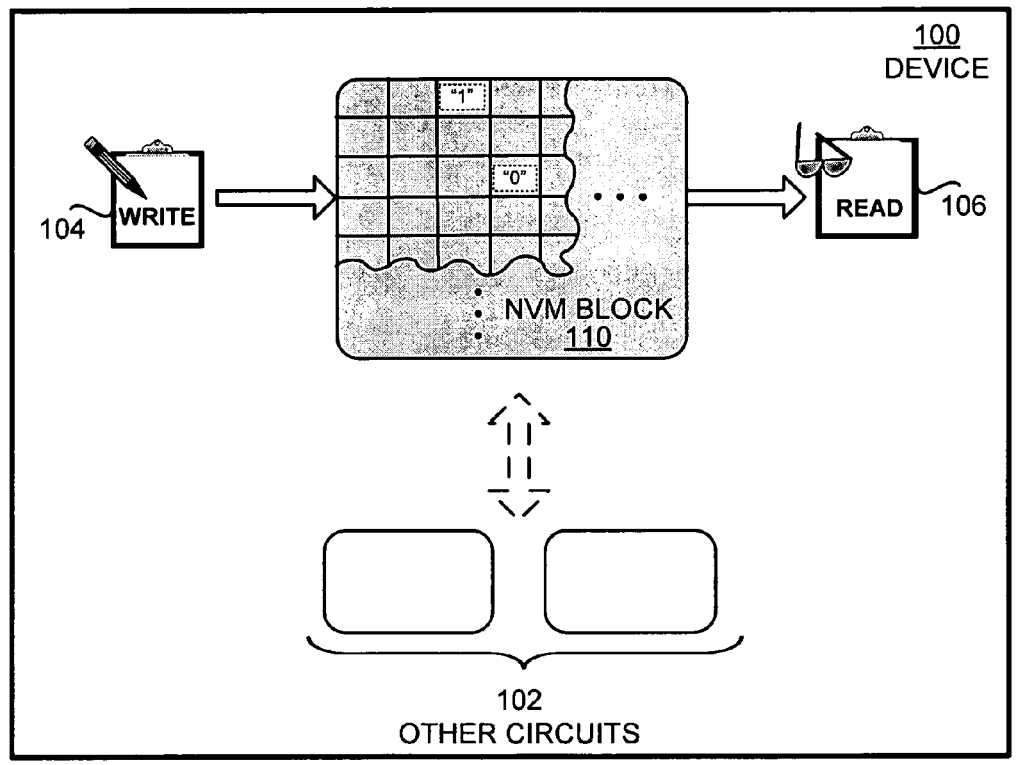
FIG. 1A is a diagram of an example electronic device with a Non Volatile Memory (NVM) block providing information to other circuitry within the electronic device according to embodiments.

Referring now to the drawings, in which like numerals represent like elements, various embodiments will be described. In particular, FIG. 1A and the corresponding discussion are intended to provide a brief, general description of a suitable environment in which embodiments may be implemented.

Referring now to FIG. 1A, a diagram of an example electronic device with a Non Volatile Memory (NVM) block is shown, where the NVM block provides information to other circuitry within the electronic device.

Device 100 includes NVM block 110 that is adapted to interact with other circuits 102. Individual cells of NVM block 110 are adapted to store information as a result of "write" operation 104 and provide the stored information as a result of "read" operation 106. The information is stored even during a power-off state of device 100.

"Read" operation 106, which provides the stored information to one or more of the other circuits 102, may occur during a transition from the power-off state to a power-on state for some parts of NVM block 110. For other parts of NVM block 110, "read" operation 106 may occur during the power-on state upon being addressed by another circuit (e.g. a controller).

As a result, different circuits of device 100 may receive data for their operation at different states of powering the device. For example, an oscillator circuit may be provided calibration data during the transition from the power-off state from one part of NVM block 110, while a digital signal processor circuit may be provided programming data after the transition.

The information stored in NVM block 110 may include analog, digital or other types of data. For example, different parts of NVM block 110 may provide logic bits, ON/OFF states, latched outputs for trimming analog circuits, and the like.

Single-ended NVM bits, which are defined as NVM bits that contain a single storage element, are sufficient for an ECP NVM, according to embodiments. Single-ended NVM bits are not fault tolerant by themselves. Charge leakage and other failure mechanisms can alter the data value stored by the NVM bit storage element, such that the original data written to the bit cannot be determined. Examples are described below in more detail.

Figure 1B:
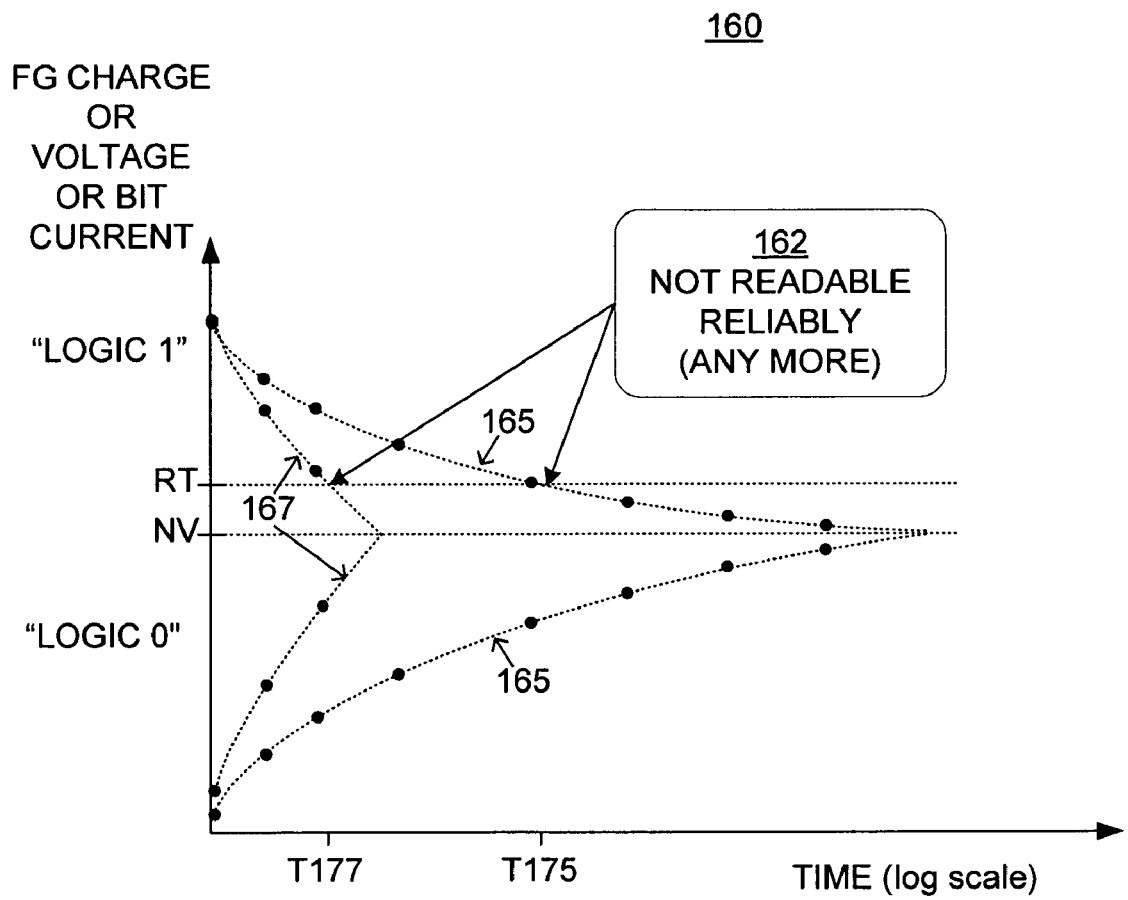
FIG. 1B is a diagram showing failure modes of a good tail bit and a bad tail bit, such as of the memory of FIG. 1A.

FIG. 1B is a diagram 160 showing failure modes of NVM bits, such as bits or cells of NVM block 110. In diagram 160 the horizontal axis denotes time, where the scale may be logarithmic. Appropriate units could be hours, days, months, or years. The vertical axis denotes a characteristic attribute of a NVM cell that indicates the stored value. Three possible characteristic attributes are listed in the alternative, whose their behavior is generally analogous for this description. Indeed, in many NVM implementations the data value may be stored as charge on a floating gate, which results in a corresponding floating gate voltage and/or bit current. In this description, therefore, when the characteristic attribute is larger enough than a read threshold RT, a logic "1" value is considered to be stored, while when the characteristic attribute is smaller than read threshold RT, a logic "0" value is considered to be stored.

While a single neutral value NV is shown, a number of them can correspond to different failure mechanisms. In such NVM implementations the dominant bit failure mechanism may be charge leakage from the floating gate, which causes the floating gate voltage and/or bit current to change. The charge leakage failure mechanism may cause the floating gate charge to leak towards, and eventually reach, a neutral charge value. In this case, neutral value NV is the neutral charge value, at which the charge leakage on to the floating gate is substantially equal to the charge leakage off of the floating gate. Other NVM bit storage elements and other bit failure mechanisms may also have a characteristic neutral value for failed bits. In diagram 160 the neutral value is shown as lower than the read threshold, however it could alternately be higher than the read threshold.

Diagram 160 thus denotes the deterioration of the characteristic attribute, as time passes. It shows dots as if they were measured data points of the characteristic attribute, along with lines tracing the long term behavior of the characteristic attribute. According to comment box 162, the NVM cell stored value becomes unreadable when its tracing line reaches read threshold RT at some time.

The failure mechanism is the same for good bits and bad bits, except the times involved are different. More particularly, a good NVM cell has a characteristic attribute whose long term evolution is described by tracing lines 165, and which thus becomes unreadable at some time T175. What makes this cell good is that its time T175 is long, e.g. many years. A bad NVM cell has a characteristic attribute whose long term evolution is described by tracing lines 167, and which thus becomes unreadable at some time T177. What makes this cell bad is that its time T177 is short e.g. a few hours or days.

Figure 1C:
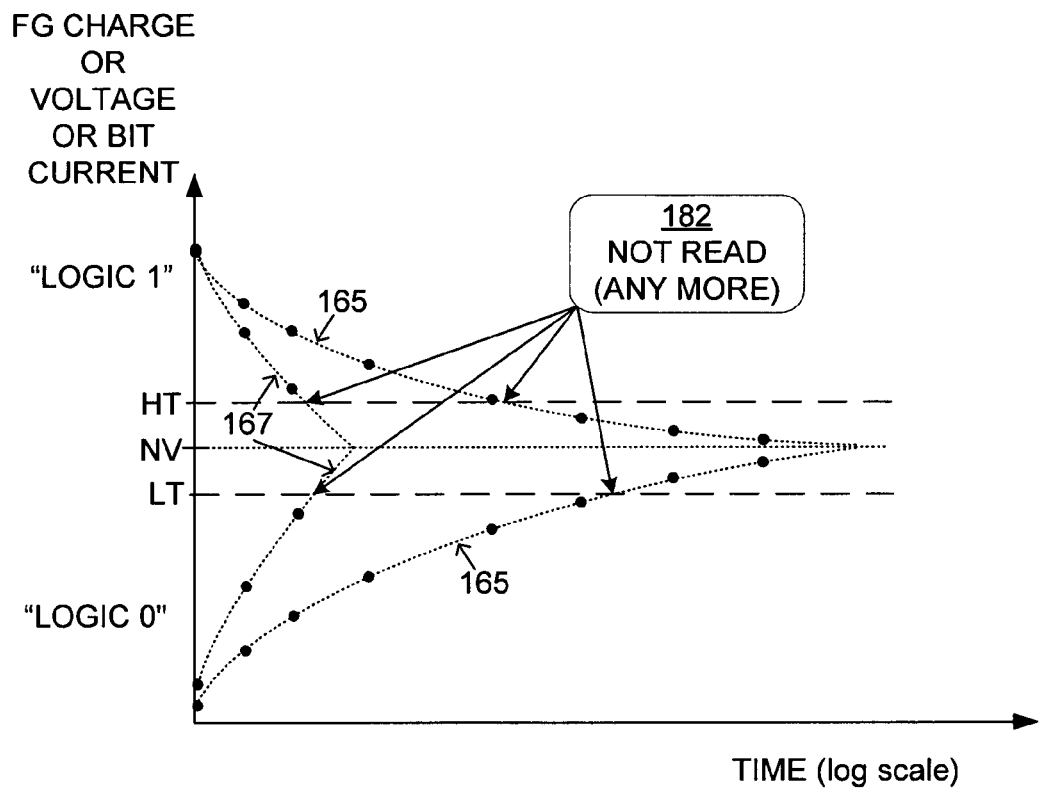
FIG. 1C is the diagram of FIG. 1B, further showing how the invention detects when a bit will no longer be used according to embodiments.

FIG. 1C shows a diagram 180. Diagram 180 is the same as diagram 160, except that it further shows how the invention detects when a bit will no longer be used according to embodiments. Detection as per FIG. 1C can take place in any number of ways.

In some embodiments, outputs of NVM cells are read employing two different threshold levels. A high threshold value HT and a low threshold value LT are superimposed, having values above and below neutral value NV respectively.

If the readings are inconsistent, the bit is detected as a bad bit. For example, a first value is obtained from a first NVM cell using a first threshold, and a second value is obtained from the first NVM cell using a second threshold. A fault is indicated in the first NVM cell in response to the first value being inconsistent with the second value. The first value being inconsistent with the second value may include the first value being different from the second value. The first value may be obtained before the second value, or concurrently with the second value.

According to comment box 182, the NVM cell stored value is not read as valid data while its characteristic attribute is between high threshold value HT and low threshold value LT. In fact, that is when the error is detected.

From then on, the output of the NVM cell can be rejected. It can be further optionally corrected in any number of ways, such as by using parity logic and so on.

Figure 2:
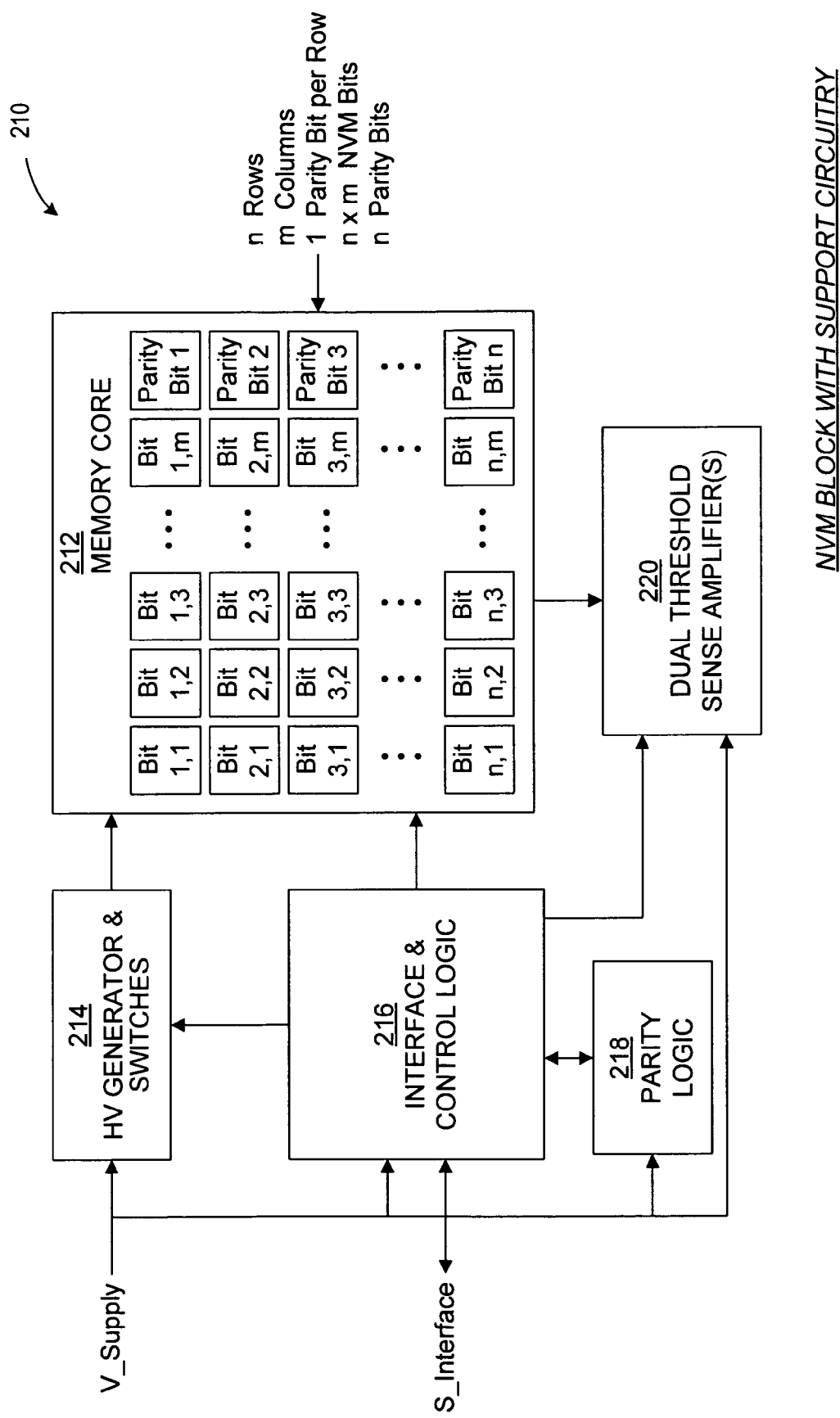
FIG. 2 is a diagram of a fault tolerant NVM block with support circuitry that can be implemented in the electronic device of FIG. 1A according to embodiments.

FIG. 2 is a diagram of a fault tolerant NVM block with support circuitry that can be implemented in the electronic device of FIG. 1A according to embodiments.

Memory block 210 includes memory core 212, High Voltage (HV) generator and switches 214, interface and control logic 216, parity logic 218, and dual threshold sense amplifier(s) 220. Memory core 212 may be organized into rows and columns. An NVM with n rows and m columns can store n×m bits.

According to some embodiments, a parity bit cell may be included in the memory core for each row. Hence, an n×m NVM includes n parity bits. Parity bits are ordinarily set during a write operation, and are used to infer a proper value of bad bit during a read operation.

HV generator and switches 214 receives supply voltage V_Supply and provides high voltage(s) for writing to memory core 212, as well as voltages to interface and control logic 216, parity logic 218, and dual threshold sense amplifier(s) 220.

Interface and control logic 216 is a digital logic circuit that controls NVM operation. Interface and control logic 216 receives interface control signal(s) S_Interface and provides control signals to memory core 212 for selection of bits, and selection signals to dual threshold sense amplifier(s) 220 for selection of thresholds as described below. Interface and control logic 216 also provides control signals to HV generator and switches 214, and interacts with parity logic 218 for selection of parity bit cells in case of fault indication from memory core reading.

Parity logic 218 is configured to control providing a parity bit to supply the correct value of the bad bit. Parity logic 218 does not need to detect which bit is bad because the dual threshold sense amplifier performs that function. In one embodiment, parity may be generated by exclusive-OR (XOR) or exclusive-NOR (XNOR) logic circuits such that total number of "1"s including parity is even (or odd). The XOR (or XNOR) logic operation excluding the bad bit but including the parity bit supplies the correct value of the bad bit.

An Error Correcting Parity (ECP) NVM typically requires less area than an Error Correction Code (ECC) NVM. For example, an ECC NVM requires 21 storage elements for 16-bits, while an ECP NVM requires 17 storage elements for 16-bits. Furthermore, parity logic 218 is simpler in design than an ECC logic.

Dual threshold sense amplifier(s) 220 receives selection signals from interface and control logic 216 and read bit values from memory core 212. Dual threshold sense amplifier(s) 220 is configured to amplify the small bit cell current or voltage to a logic level voltage compatible with the interface and control logic. A typical NVM array may include a single sense amplifier for the whole array or one amplifier per column. Operation of dual threshold sense amplifier(s) 220 is described in more detail below.

Returning to FIG. 2, NVM block 210 uses dual threshold sense amplifier(s) 220 to detect bad bits. Dual threshold sense amplifier(s) 220 has two thresholds, one above and one below a neutral value. Good bits are either above both or below both thresholds. Bad bits leak to the neutral value in between the two thresholds. According to some embodiments, two sense amplifiers with different thresholds are used. According to other embodiments, the same sense amplifier is used twice with a different threshold each time.

Figure 3:
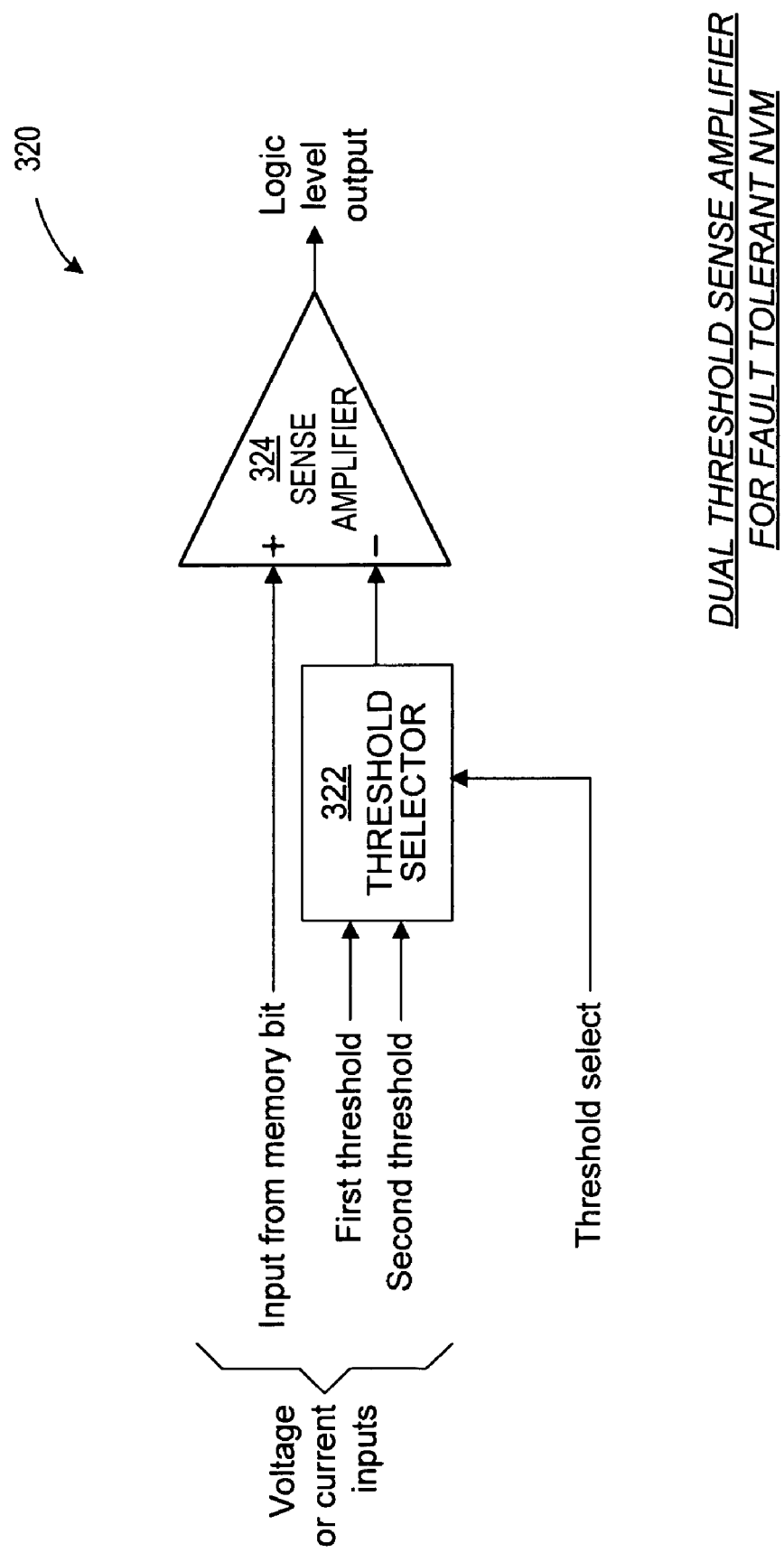
FIG. 3 is a diagram of a dual threshold sense amplifier for the fault tolerant NVM block of FIG. 2 according to embodiments.

FIG. 3 is a diagram of a dual threshold sense amplifier for the fault tolerant NVM block of FIG. 2 according to embodiments.

Dual threshold sense amplifier 320 includes threshold selector 322 and sense amplifier 324. As explained above, dual threshold sense amplifier 320 converts memory bit data to logic levels. The memory bit data input may be either current or voltage.

Dual thresholds are used to identify bad memory bits. In operation, a first threshold signal and a second threshold signal (voltage or current) are provided to threshold selector 322.

Threshold select signal from interface and control logic circuit is also provided to threshold selector 322 such that one of the threshold signals is provided to sense amplifier 324 for each read in alternating order.

Another input of sense amplifier is configured to receive a reading from the selected memory bit. As mentioned previously, good bits are either above both or below both thresholds. Bad bits leak to the neutral value in between the two thresholds.

Sense amplifier 324 compares the memory bit reading to both thresholds and determines whether or not the reading is a good bit or bad bit. If the reading is bad, parity bit reading is used to correct the reading.

Figure 4:
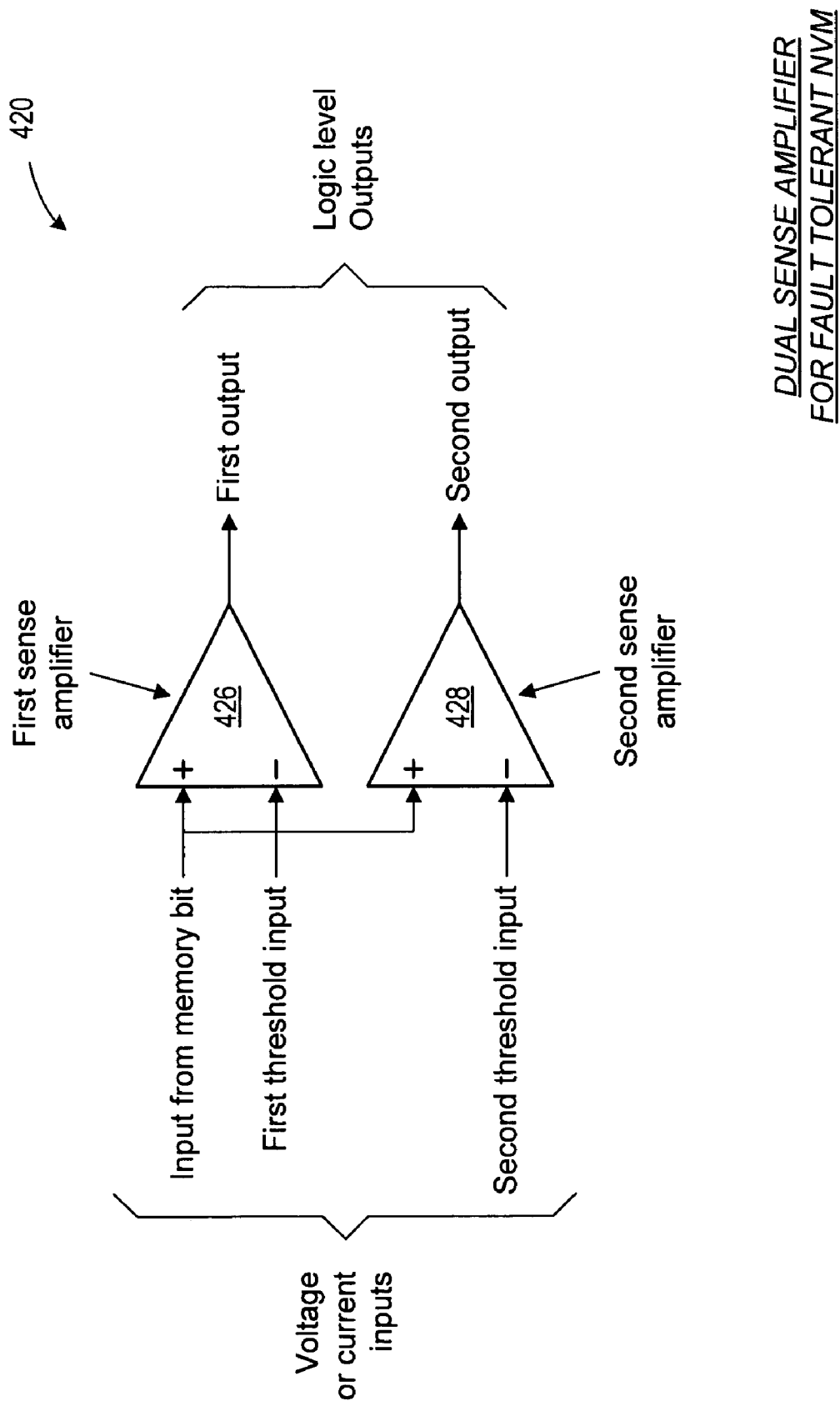
FIG. 4 is a diagram of a dual sense amplifier for the fault tolerant NVM block of FIG. 2 according to embodiments.

FIG. 4 is a diagram of a dual sense amplifier for the fault tolerant NVM block of FIG. 2 according to embodiments.

Dual sense amplifier 420 includes first sense amplifier 426 and second sense amplifier 428. One input of each sense amplifier is configured to receive the reading from the selected memory bit.

Another input of first sense amplifier 426 is arranged to receive a first threshold signal (current or voltage). Similarly, another input of second sense amplifier 428 is arranged to receive a second threshold signal.

First and second sense amplifiers 426 and 428 compare the reading from the selected memory bit to the first and second threshold signals, respectively, and provide first and second outputs. First and second outputs are at logic levels. If the first and second outputs are consistent, the reading is a good reading. If the outputs are not consistent, the reading is a bad reading, and a corrected reading may be obtained using the associated parity bit.

Essentially, dual sense amplifier 420 is a parallel version of dual threshold sense amplifier 320 of FIG. 3. In some embodiments, first and second sense amplifiers 426 and 428 may operate synchronously to improve operation speed.

An example operation is described below:

During write operation: Example bits 1 1 0 1 are programmed. A parity value is determined from their values, e.g. 1 for even number of 1s. The parity value is programmed in parity bit.

During read: Bits are read using both thresholds, and provided to parity logic. Parity logic first tests with the dual threshold test: Have any bits in a row failed? If no, operation proceeds with next read. If one bit has failed (e.g. 1 X 0 1), the parity bit is consulted. Then, the value of failed bit is inferred, for there to be an even number of 1's.

According to some embodiments, a method for an NVM device includes obtaining a first value from a first NVM cell using a first threshold, obtaining a second value from the first NVM cell using a second threshold, and indicating a fault in the first NVM cell in response to the first value being inconsistent with the second value. The method may further include determining an output value of the first NVM cell using a parity bit value in response to a fault indicated in the first NVM cell.

The first NVM cell may be part of a set of NVM cells, the parity value being derived from the set of NVM cells. The set of NVM cells may include the first NVM cell, a second NVM cell, and a parity NVM cell.

The first value being inconsistent with the second value may include the first value being different from the second value. According to one embodiment, the first value may be obtained before the second value. According to another embodiment, the first value may be obtained concurrently with the second value.

According to further embodiments, the method may also include reading a third value from a second NVM cell using the first threshold, reading a fourth value from the second NVM cell using the second threshold, and comparing the third and fourth values in determining an output value of the second NVM cell.

A fault in the first NVM cell may result in a current, provided by the first NVM cell in reading the first NVM cell, being between the first and second thresholds. A fault in the first NVM cell may also cause a voltage stored by the first NVM cell to lie between the first and second thresholds.

According to other embodiments, a device includes a memory circuit operable to store a value for use by another circuit of the same device. The memory circuit includes a memory block with a plurality of sets of NVM memory cells, each set of NVM memory cells comprising a plurality of data NVM cells and a parity NVM cell. The memory circuit also includes a sense amplifier circuit operable to read data stored in the memory block, where in reading a first data NVM cell of a first set of NVM memory cells of the memory block, the sense amplifier circuit is to obtain first and second values using first and second thresholds, respectively. The memory circuit further includes a logic circuit operable to indicate a fault in the first data NVM cell in response to the first and second values being inconsistent.

The sense amplifier circuit may include a plurality of sense amplifiers. In one embodiment, the plurality of sense amplifiers may include a first sense amplifier coupled to receive the first threshold to obtain the first value, and a second sense amplifier coupled to receive the second threshold to obtain the second value.

The first value being inconsistent with the second value may include the first value being different from the second value. The first value may be obtained before the second value or concurrently with the second value.

The sense amplifier circuit may include a threshold selector to selectively provide the first threshold to a sense amplifier to obtain the first value and to selectively provide the second threshold to the sense amplifier to obtain the second value.

According to further embodiments, the memory circuit may further include a parity circuit to determine an output value of the first data NVM cell using a value obtained from the parity NVM cell of the first set of NVM cells in response to a fault indicated in the first data NVM cell.

The device including the memory circuit may be suitable for use with an antenna for transmitting a wireless signal that is modulated with the output value. The device may be part of a Radio Frequency Identification (RFID) tag, a portable wireless telephone, or a portable wireless general purpose computer.

Figure 5:
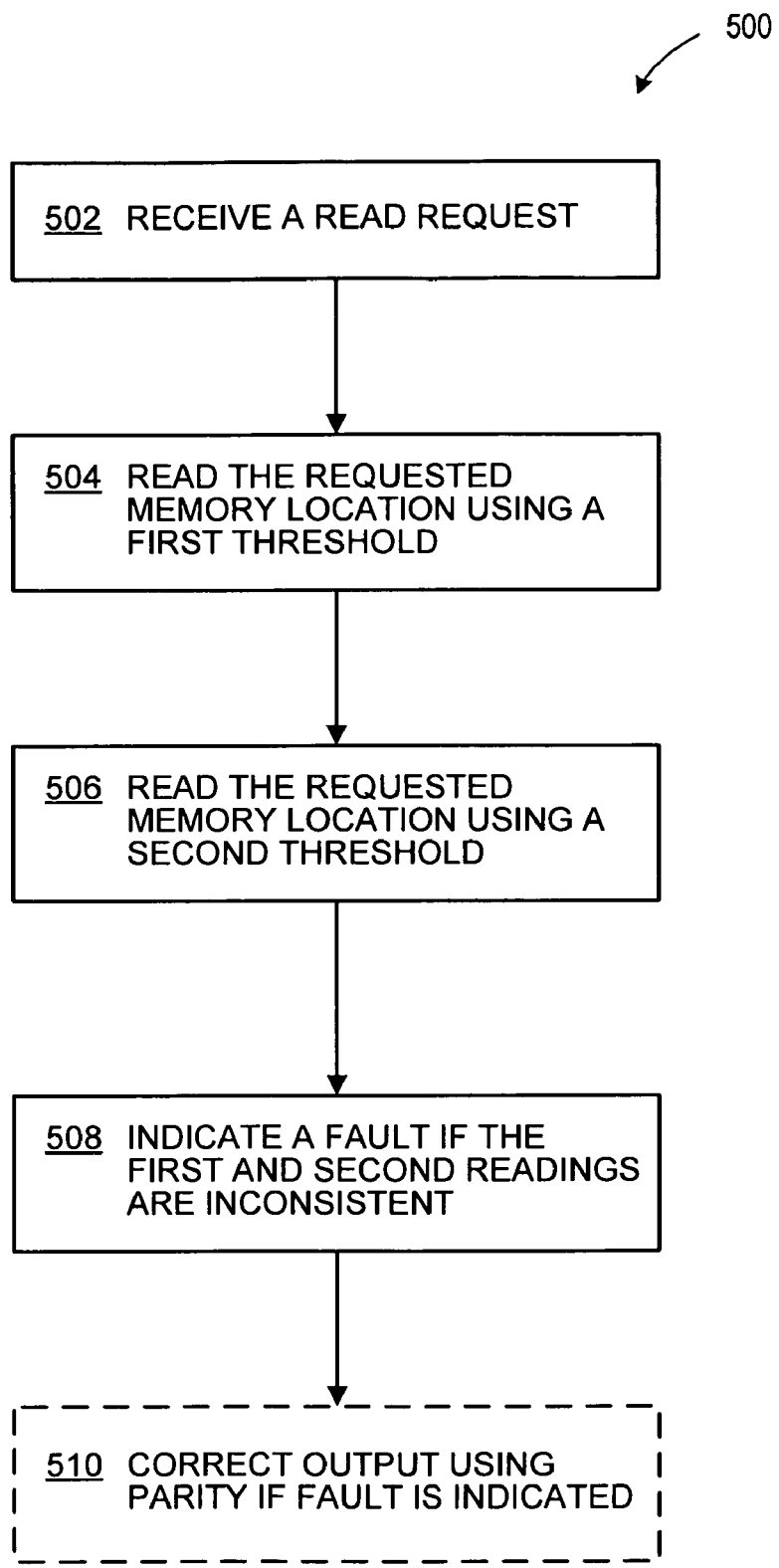
FIG. 5 is a flowchart of a process for operating a fault tolerant NVM block according to embodiments.

FIG. 5 is a flowchart of a process for operating a fault tolerant NVM block according to embodiments. The method of flowchart 500 may be implemented in a fault tolerant NVM circuit such as NVM block 110 of FIG. 1A.

According to an operation 502, a read request is received. Different circuits may request data from different locations of the NVM circuit. As explained previously, some circuits may request data upon power-on transition, others may request data during operation.

According to a next operation 504, the requested memory location is read using a first threshold. A sense amplifier may be employed to read the memory location using the first threshold.

According to a next operation 506, the requested memory location is read using a second threshold. The first and second readings may be performed consecutively or concurrently.

According to a next operation 508, a fault is indicated if the first and second readings are inconsistent. The first reading may be considered inconsistent with the second reading, if the two read values are different from each other.

According to next optional operation 510, the output is corrected using parity when fault is indicated. In an NVM circuit, the output may be determined based on the data value of a parity NVM cell in case of fault.

In the above, the order of operations is not constrained to what is shown, and different orders may be possible. In addition, actions within each operation can be modified, deleted, or new ones added without departing from the scope and spirit of the invention. Plus other, optional operations and actions can be implemented with these methods, as will be inferred from the earlier description.

Figure 6:
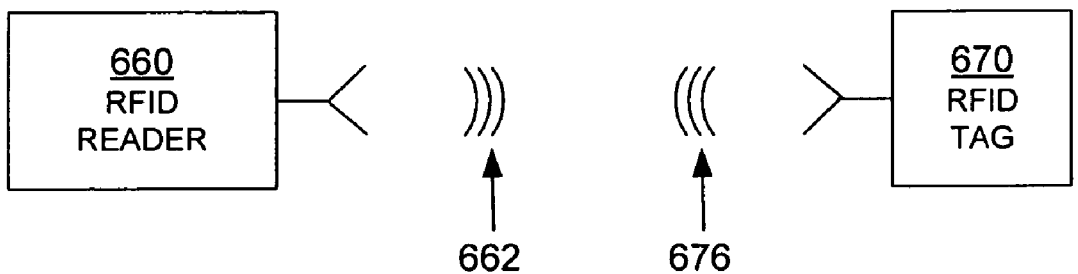
FIG. 6 is a block diagram of components of an RFID system.

FIG. 6 is a diagram of components of a typical RFID system 650, incorporating aspects of the invention. An RFID reader 660 transmits an interrogating Radio Frequency (RF) wave 662. RFID tag 670 in the vicinity of RFID reader 660 may sense interrogating RF wave 662, and generate wave 676 in response. RFID reader 660 senses and interprets wave 676.

Reader 660 and tag 670 exchange data via wave 662 and wave 676. In a session of such an exchange, each encodes, modulates, and transmits data to the other, and each receives, demodulates, and decodes data from the other. The data is modulated onto, and decoded from, RF waveforms.

Encoding the data in waveforms can be performed in a number of different ways. For example, protocols are devised to communicate in terms of symbols, also called RFID symbols. A symbol for communicating can be a delimiter, a calibration symbol, and so on. Further symbols can be implemented for ultimately exchanging binary data, such as "0" and "1", if that is desired.

Tag 670 can be a passive tag or an active tag, i.e. having its own power source. Where tag 670 is a passive tag, it is powered from wave 662.

Figure 7:
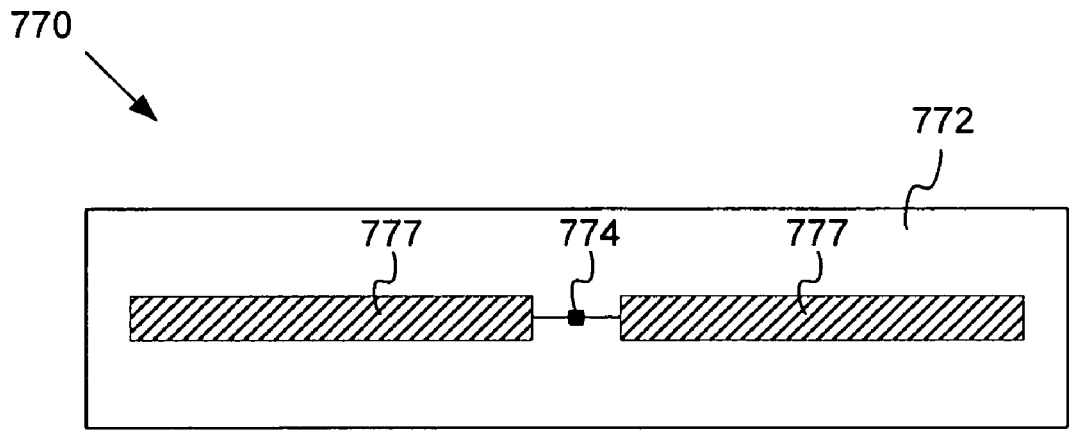
FIG. 7 is a diagram showing components of an RFID tag that can be used in the system of FIG. 6, and that can include a fault tolerant NVM block, such as the NVM block of FIG. 2.

FIG. 7 is a diagram of an RFID tag 770, which can be the same as tag 670 of FIG. 6. Tag 770 is implemented as a passive tag, meaning it does not have its own power source. Much of what is described in this document, however, applies also to active tags.

Tag 770 is formed on a substantially planar inlay 772, which can be made in many ways known in the art. Tag 770 also includes antenna segments 777, which are usually flat and attached to inlay 772. Antenna segments 777 are shown here forming a dipole, but many other embodiments using any number of antenna segments are possible.

Tag 770 also includes an electrical circuit, which is preferably implemented in an integrated circuit (IC) 774. IC 774 is also arranged on inlay 772, and electrically coupled to antenna segments 777. Only one method of coupling is shown, while many are possible.

In operation, a signal is received by antenna segments 777, and communicated to IC 774. IC 774 both harvests power, and decides how to reply, if at all. If it has decided to reply, IC 774 modulates the reflectance of antenna segments 777, which generates the backscatter from a wave transmitted by the reader. Coupling together and uncoupling antenna segments 777 can modulate the reflectance, as can a variety of other means.

In the embodiment of FIG. 7, antenna segments 777 are separate from IC 774. In other embodiments, antenna segments may alternately be formed on IC 774, and so on.

Figure 8:
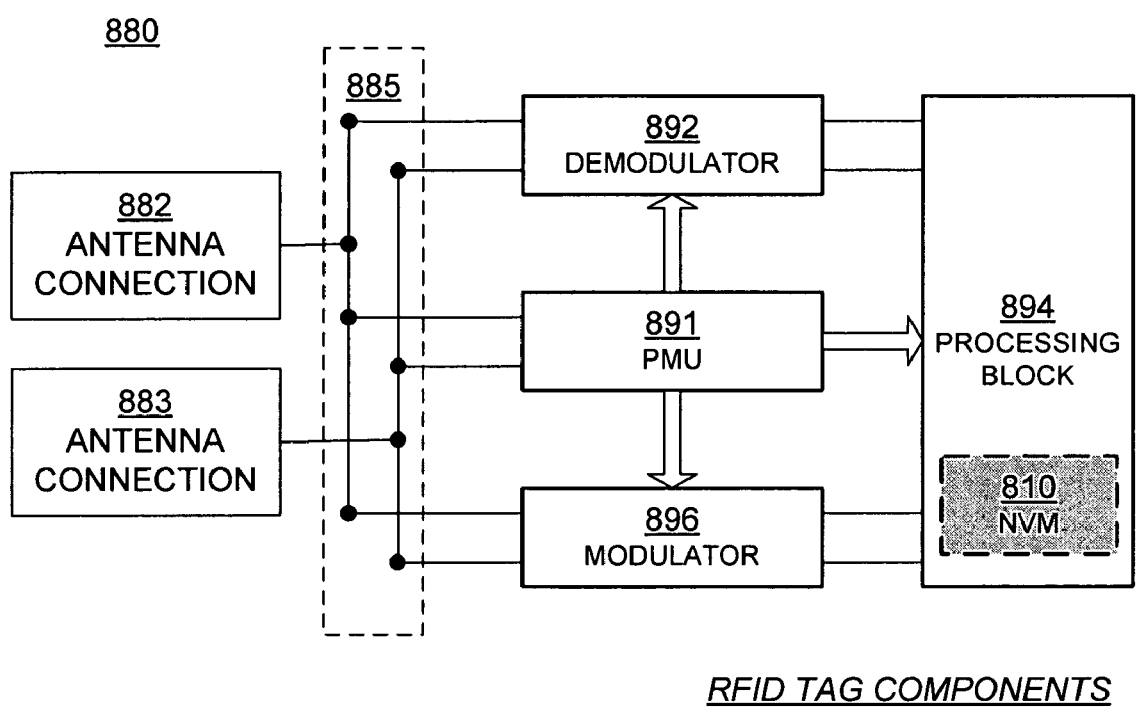
FIG. 8 is a block diagram of an implementation of an electrical circuit formed in an IC of the tag of FIG. 7.

FIG. 8 is a block diagram of an electrical circuit 880. Circuit 880 may be formed in an IC of an RFID tag, such as IC 774 of FIG. 7. Circuit 880 has a number of main components that are described in this document. Circuit 880 may have a number of additional components from what is shown and described, or different components, depending on the exact implementation.

Circuit 880 includes at least two antenna connections 882, 883, which are suitable for coupling to one or more antenna segments (not shown in FIG. 7). Antenna connections 882, 883 may be made in any suitable way, such as pads and so on. In a number of embodiments more than two antenna connections are used, especially in embodiments where more antenna segments are used.

Circuit 880 includes a section 885. Section 885 may be implemented as shown, for example as a group of nodes for proper routing of signals. In some embodiments, section 885 may be implemented otherwise, for example to include a receive/transmit switch that can route a signal, and so on.

Circuit 880 also includes a Power Management Unit (PMU) 891. PMU 891 may be implemented in any way known in the art, for harvesting raw RF power received via antenna connections 882, 883. In some embodiments, PMU 891 includes at least one rectifier, and so on.

In operation, an RF wave received via antenna connections 882, 883 is received by PMU 891, which in turn generates power for components of circuit 880. This is true for either or both of R→T sessions (when the received RF wave carries a signal) and T→R sessions (when the received RF wave carries no signal).

Circuit 880 additionally includes a demodulator 892. Demodulator 892 demodulates an RF signal received via antenna connections 882, 883. Demodulator 892 may be implemented in any way known in the art, for example including an attenuator stage, amplifier stage, and so on.

Circuit 880 further includes a processing block 894. Processing block 894 receives the demodulated signal from demodulator 892, and may perform operations. In addition, it may generate an output signal for transmission.

Processing block 894 may be implemented in any way known in the art. For example, processing block 894 may include a number of components, such as a processor, a memory, a decoder, an encoder, and so on. According to one embodiment, processor 894 includes NVM 810, which operates as described in conjunction with FIGS. 2, 3, and 4.

Circuit 880 additionally includes a modulator 896. Modulator 896 modulates an output signal generated by processing block 894. The modulated signal is transmitted by driving antenna connections 882, 883, and therefore driving the load presented by the coupled antenna segment or segments. Modulator 896 may be implemented in any way known in the art, for example including a driver stage, amplifier stage, and so on.

In one embodiment, demodulator 892 and modulator 896 may be combined in a single transceiver circuit. In another embodiment, modulator 896 may include a backscatter transmitter or an active transmitter. In yet other embodiments, demodulator 892 and modulator 896 are part of processing block 894.

It will be recognized at this juncture that circuit 880 can also be the circuit of an RFID reader according to the invention, without needing PMU 891. Indeed, an RFID reader can typically be powered differently, such as from a wall outlet, a battery, and so on. Additionally, when circuit 880 is configured as a reader, processing block 894 may have additional Inputs/Outputs (I/O) to a terminal, network, or other such devices or connections. In terms of processing a signal, circuit 880 operates differently during a R→T session and a T→R session.

In this description, numerous details have been set forth in order to provide a thorough understanding. In other instances, well-known features have not been described in detail in order to not obscure unnecessarily the description.

A person skilled in the art will be able to practice the present invention in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and sub-combinations of elements, features, steps, and/or functions, which are regarded as novel and non-obvious. Additional claims for other combinations and sub-combinations may be presented in this or a related document.

What is claimed is:

1. A device comprising a memory circuit operable to store a value for use by another circuit of the device, the memory circuit comprising:
   a memory block comprising a plurality of sets of NVM memory cells, wherein each set of NVM memory cells comprises a plurality of data NVM cells and a parity NVM cell;
   a sense amplifier circuit operable to read data stored in the memory block, wherein in reading a first data NVM cell of a first set of NVM memory cells of the memory block the sense amplifier circuit is to obtain first and second values using first and second thresholds, respectively, and wherein the sense amplifier circuit includes a first sense amplifier coupled to receive the first threshold to obtain the first value, and a second sense amplifier coupled to receive the second threshold to obtain the second value; and
   a logic circuit operable to indicate a fault in the first data NVM cell in response to the first and second values being inconsistent.

2. The device of claim 1, wherein the first value being inconsistent with the second value includes the first value being different from the second value.

3. The device of claim 1, wherein the first value is obtained before the second value.

4. The device of claim 1, wherein the first value is obtained concurrently with the second value.

5. The device of claim 1, wherein a fault in the first data NVM cell causes a current provided by the first data NVM cell in reading the first NVM cell to lie between the first and second thresholds.

6. The device of claim 1, wherein a fault in the first data NVM cell causes a voltage stored by the first data NVM cell to lie between the first and second thresholds.

7. The device of claim 1, wherein the first data NVM cell includes a single storage element.

8. The device of claim 1, wherein the sense amplifier circuit includes a threshold selector to selectively provide the first threshold to a sense amplifier to obtain the first value and to selectively provide the second threshold to the sense amplifier to obtain the second value.

9. The device of claim 1, wherein the memory circuit further comprises:
   a parity circuit to determine an output value of the first data NVM cell using a value obtained from the parity NVM cell of the first set of NVM cells in response to a fault indicated in the first data NVM cell.

10. The device of claim 9, wherein the device is suitable for use with an antenna for transmitting a wireless signal that is modulated with the output value.

11. The device of claim 10, wherein the device is a circuit for a Radio Frequency Identification (RFID) tag.

12. The device of claim 10, wherein the device is a circuit for a portable wireless telephone.

13. The device of claim 10, wherein the device is a circuit for a portable wireless general purpose computer.

14. A memory circuit comprising:
   first means for obtaining a first value from a first NVM cell using a first threshold;
   second means for obtaining a second value from the first NVM cell using a second threshold; and
   indicating means for indicating a fault in the first NVM cell in response to the first value being inconsistent with the second value,
   wherein the first value is obtained concurrently with the second value.

15. The circuit of claim 14, further comprising:
   parity means for determining an output value of the first NVM cell using a parity bit value in response to a fault indicated in the first NVM cell.

16. The circuit of claim 14, wherein the first value being inconsistent with the second value includes the first value being different from the second value.

17. A method for a device that includes a Non Volatile Memory (NVM), comprising:
   obtaining a first value from a first NVM cell using a first threshold;
   obtaining a second value from the first NVM cell using a second threshold; and indicating a fault in the first NVM cell in response to the first value being inconsistent with the second value, wherein the first value is obtained concurrently with the second value.

18. The method of claim 17, further comprising:

determining an output value of the first NVM cell using a parity bit value in response to a fault indicated in the first NVM cell.

19. The method of claim 18, wherein the first NVM cell is part of a set of NVM cells, the parity value being derived from the set of NVM cells.

20. The method of claim 19, wherein the set of NVM cells comprises the first NVM cell, a second NVM cell, and a parity NVM cell.

21. The method of claim 17, wherein the first value being inconsistent with the second value includes the first value being different from the second value.

22. The method of claim 17, further comprising:

reading a third value from a second NVM cell using the first threshold;

reading a fourth value from the second NVM cell using the second threshold; and comparing the third and fourth values in determining an output value of the second NVM cell.

23. The method of claim 17, wherein a fault in the first NVM cell causes a current provided by the first NVM cell in reading the first NVM cell to lie between the first and second thresholds.

24. The method of claim 17, wherein a fault in the first NVM cell causes a voltage stored by the first NVM cell to lie between the first and second thresholds.

25. A device comprising a memory circuit operable to store a value for use by another circuit of the device, the memory circuit comprising:

a memory block comprising a plurality of sets of NVM memory cells, in which each set of NVM memory cells comprises a plurality of data NVM cells and a parity NVM cell;

a sense amplifier circuit operable to read data stored in the memory block, in which in reading a first data NVM cell of a first set of NVM memory cells of the memory block the sense amplifier circuit is to obtain first and second values using first and second thresholds, respectively; and a logic circuit operable to indicate a fault in the first data NVM cell in response to the first and second values being inconsistent, wherein the first value is obtained concurrently with the second value.

* * * * *